(12) United States Patent
Asano et al.

(10) Patent No.: US 6,940,280 B2
(45) Date of Patent: Sep. 6, 2005

(54) SYSTEMS AND METHODS FOR MANIPULATING CHANGES IN PHASE ENCODES

(75) Inventors: Kenji Asano, Tokyo (JP); Susumu Kosugi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/123,329

(22) Filed: Apr. 16, 2002

(65) Prior Publication Data

US 2002/0149366 A1 Oct. 17, 2002

(30) Foreign Application Priority Data

Apr. 17, 2001 (JP) ........................................ 2001-117588

(51) Int. Cl.$^7$ ................................................. G01V 3/00
(52) U.S. Cl. ...................................................... 324/307
(58) Field of Search ................................ 324/306, 307, 324/309; 600/410, 411

(56) References Cited

U.S. PATENT DOCUMENTS

| | | | | |
|---|---|---|---|---|
| 5,329,925 A | * | 7/1994 | NessAiver | 600/413 |
| 5,348,011 A | * | 9/1994 | NessAiver | 600/411 |
| 5,488,298 A | * | 1/1996 | Wright et al. | 324/309 |
| 5,497,088 A | | 3/1996 | Hayano et al. | |
| 5,602,891 A | | 2/1997 | Pearlman | |
| 5,621,321 A | * | 4/1997 | Liu et al. | 324/309 |
| 5,631,560 A | | 5/1997 | Machida | |
| 5,713,358 A | | 2/1998 | Mistretta et al. | |
| 5,729,139 A | | 3/1998 | Goto | |
| 5,742,163 A | * | 4/1998 | Liu et al. | 324/309 |
| 5,766,128 A | * | 6/1998 | Halamek et al. | 600/410 |
| 5,818,229 A | | 10/1998 | Kanazawa | |
| 5,833,610 A | | 11/1998 | Yokawa et al. | |
| 5,865,747 A | * | 2/1999 | Steckner | 600/413 |
| 5,883,514 A | * | 3/1999 | Ishikawa | 324/309 |
| 5,909,119 A | | 6/1999 | Zhang et al. | |
| 5,952,827 A | | 9/1999 | Feinberg | |
| 6,025,714 A | | 2/2000 | Avram et al. | |
| 6,054,853 A | | 4/2000 | Miyamoto et al. | |
| 6,066,949 A | | 5/2000 | Alley et al. | |
| 6,127,826 A | | 10/2000 | Thompson et al. | |
| 6,144,874 A | * | 11/2000 | Du | 600/413 |
| 6,147,493 A | * | 11/2000 | Miyoshi | 324/312 |
| 6,154,029 A | * | 11/2000 | Miyamoto et al. | 324/312 |
| 6,169,398 B1 | | 1/2001 | Watanabe et al. | |
| 6,198,959 B1 | * | 3/2001 | Wang | 600/413 |
| 6,201,393 B1 | | 3/2001 | Bernstein et al. | |
| 6,201,985 B1 | * | 3/2001 | Polzin et al. | 600/411 |
| 6,249,595 B1 | * | 6/2001 | Foxall et al. | 382/128 |
| 6,252,400 B1 | | 6/2001 | Loncar et al. | |
| 6,255,820 B1 | | 7/2001 | Steckner | |
| 6,265,873 B1 | | 7/2001 | Le Roux | |
| 6,278,273 B1 | * | 8/2001 | Riederer et al. | 324/309 |
| 6,288,544 B1 | | 9/2001 | Bernstein et al. | |
| 6,341,179 B1 | | 1/2002 | Stoyle et al. | |
| 6,359,436 B1 | | 3/2002 | Miyamoto et al. | |
| 6,377,831 B1 | | 4/2002 | Seshan et al. | |
| 6,377,834 B1 | * | 4/2002 | Zhou et al. | 600/412 |
| 6,380,739 B1 | | 4/2002 | Machida | |
| 6,414,487 B1 | * | 7/2002 | Anand et al. | 324/309 |
| 6,476,607 B1 | * | 11/2002 | Dannels et al. | 324/309 |
| 6,493,569 B2 | * | 12/2002 | Foo et al. | 600/410 |
| 6,512,372 B1 | * | 1/2003 | Ikezaki | 324/312 |
| 6,518,759 B2 | * | 2/2003 | Bernstein | 324/307 |

FOREIGN PATENT DOCUMENTS

| | | | |
|---|---|---|---|
| JP | 10-005191 | | 1/1998 |
| JP | 216125 | * | 11/1999 |
| JP | 3051374 | | 3/2000 |

* cited by examiner

*Primary Examiner*—Louis Arana
*Assistant Examiner*—Dixomara Vargas
(74) *Attorney, Agent, or Firm*—Carl B. Horton, Esq.; Armstrong Teasdale LLP

(57) ABSTRACT

To reduce artifacts caused by sudden change of a phase encode amount, data Hj, Mj, and Lj having a large phase encode amount are collected, and then, when collecting data $C_{3j-4}$, $C_{3j-3}$, and $C_{3j-2}$ having a small phase encode amount, a buffer pulse sequence having an intermediate phase encode amount (+9) or (+49) is inserted one or more times between both.

24 Claims, 8 Drawing Sheets

MRI system
100 k space K

| Phase encode axis direction | | Phase encode amount |
|---|---|---|
| | Third region H | +89 ~ 128 |
| | Second region M | +49 ~ 88 ← +49 |
| | First region L | +9 ~ 48 ← +9 |
| | Zeroth region C | -7 ~ +8 |
| | First region L | -47 ~ -6 |
| | Second region M | -87 ~ -46 |
| | Third region H | -127 ~ -88 |

Frequency axis direction

| k space K | Phase encode amount |
|---|---|
| Third region H | +89 ~ 128 |
| Second region M | +49 ~ 88 |
| First region L | +9 ~ 48 |
| Zeroth region C | -7 ~ +8 |
| First region L | -47 ~ -6 |
| Second region M | -87 ~ -46 |
| Third region H | -127 ~ -88 |

Phase encode axis direction

Frequency axis direction

SYSTEMS AND METHODS FOR MANIPULATING CHANGES IN PHASE ENCODES

CROSS REFERENCE TO RELATED APPLICATIONS

This application claims the benefit of Japanese Application No. 2001-117588 filed Apr. 17, 2001.

BACKGROUND OF THE INVENTION

The present invention relates to a data collection method and an MRI (Magnetic Resonance Imaging) system, more specifically, to a data collection method and an MRI system which can reduce artifacts caused by sudden change of a phase encode amount.

FIGS. 11 and 12 are explanatory views showing the data collection method disclosed in Japanese Unexamined Patent Publication No. Hei 10-5191 and U.S. Pat. No. 3,051,374.

First, as shown in FIG. 11, a k space K is divided into seven regions in total of a zeroth region C positioned in the center of the phase encode axis direction, two first regions L adjacent to the outside of the zeroth region C, two second regions M adjacent to the outside of the first regions L, and two third regions H adjacent to the outside of the second regions M.

The phase encode amount of the zeroth region C is, e.g., −7 to +8. The phase encode amounts of the first regions L are, e.g., −47 to −6 and +9 to 48. The phase encode amounts of the second regions M are, e.g., −87 to −46 and +49 to 88. The phase encode amounts of the third regions H are, e.g., −127 to −88 and +89 to 128. The phase encode amount is a value conceptionally representing the polarity and magnitude order.

Data collection is performed in the order as shown in FIG. 12.

In other words, data H1 of the third region H, data M1 of the second region M, data L1 of the first region L, and data C1 of the zeroth region C are collected.

With j=2, data Hj of the third region H and data $C_{3j-4}$ of the zeroth region C are collected.

Data Mj of the second region H and data $C_{3j-3}$ of the zeroth region C are collected.

Data Lj of the first region H and data $C_{3j-2}$ of the zeroth region C are collected.

While changing j to 3, 4, . . . , data collection and image reconstruction are repeated.

After collecting the zeroth region C data, the image reconstruction is performed using the latest zeroth region C data, the past latest third region H data, second region M data, and first region L data. In the reconstructing method, as shown in FIG. 13, an image f (H1, M1, L1, C1) is first reconstructed. Then, with j=2, an image f (Hj, $M_{j-1}$, $L_{j-1}$, $C_{3j-4}$) is reconstructed, an image f (Hj, Mj, $L_{j-1}$, $C_{3j-3}$) is reconstructed, and an image f (Hj, Mj, Lj, $C_{3j-2}$) is reconstructed. While changing j to 3, 4, . . . , the image reconstruction is repeated.

Japanese Unexamined Patent Publication No. Hei 10-5191 and U.S. Pat. No. 3,051,374 disclose other various image reconstructing methods.

In the prior art data collection method shown in FIGS. 11 and 12, the zeroth region C data is sometimes collected immediately after collecting the third region H data. At this time, the phase encode amount of the pulse sequence is suddenly changed, e.g., from +89 to +8. In addition, the zeroth region C data is sometimes collected immediately after collecting the second region M data. At this time, the phase encode amount of the pulse sequence is suddenly changed, e.g., from +49 to +8.

However, when the phase encode amount is changed suddenly immediately before collecting the zeroth region C data governing an image, artifacts appear on the image by the influence of remaining magnetization or overcurrent.

SUMMARY OF THE INVENTION

Therefore, an object of the present invention is to provide a data collection method and an MRI system which can reduce artifacts caused by sudden change of a phase encode amount.

In a first aspect, the present invention provides a data collection method which divides a k space into (2I+1) regions in total of a zeroth region positioned in the center of the phase encode axis direction, two first regions adjacent to the outside of the zeroth region, and an (i+1)th regions adjacent to the outside of an ith (=1 to I−1, and I≧2) regions, and repeats an nth (n is one selected from 1 to I) region data collection and the zeroth region data collection while changing the n successively, thereby updating data filling the k space, wherein a pulse sequence of the phase encode amount included in the first region is inserted one or more times between the nth region data collection and the zeroth region data collection.

In the data collection method of the first aspect, a pulse sequence of the phase encode amount included in the first region adjacent to the outside of the zeroth region is inserted one or more times between the nth region data collection and the zeroth region data collection. It is therefore possible to avoid sudden change of the phase encode amount immediately before collecting the zeroth region data governing an image. Artifacts caused by the influence of remaining magnetization or overcurrent can be reduced.

In a second aspect, the present invention provides the thus-constructed data collection method, wherein the phase encode amount included in the first region is a phase encode amount in which a difference between the phase encode amount included in the first region and the phase encode amount of the first pulse sequence of the zeroth region data collection is smallest.

In the data collection method of the second aspect, it is possible to minimize change of the phase encode amount immediately before collecting the zeroth region data governing an image. Accordingly, artifacts caused by the influence of remaining magnetization or overcurrent can be minimum.

In a third aspect, the present invention provides a data collection Method which divides a k space into (2I+1) regions in total of a zeroth region positioned in the center of the phase encode axis direction, two first regions adjacent to the outside of the zeroth region, and an (i+1)th regions adjacent to the outside of an ith (=1 to I−1, and I≧3) regions, and repeats an nth (n is one selected from 1 to I) region data collection and the zeroth region data collection while changing the n successively, thereby updating data filling the k space, wherein with n=1 or n=2, a pulse sequence of the pulse encode amount in the first region is inserted (I−1) times between the nth region data collection and the zeroth region data collection; and with n≧3, a pulse sequence of the phase encode amount included in from an (n−1)th region to the first region is inserted (I−1) times in total.

In the data collection method of the third aspect, a pulse sequence of the phase encode amount included in the first region adjacent to the outside of the zeroth region is inserted (I−1) times between the first region data collection and the zeroth region data collection or between the second region data collection and the zeroth region data collection. In addition, a pulse sequence of the phase encode amount included in from the third region or a region inwardly adjacent to a region farther than the third region to the first region is inserted (I−1) times between the third region or the farther region data collection and the zeroth region data collection. This makes it possible to avoid sudden change of the phase encode amount immediately before collecting the zeroth region data governing an image. Accordingly, artifacts caused by the influence of remaining magnetization or overcurrent can be reduced.

In a fourth aspect, the present invention provides the thus-constructed data collection method, wherein the phase encode amount included in from the (n−1)th region to the first region is a phase encode amount in which a difference between the phase encode amount included in from the (n−1)th region to the first region and the phase encode amount of the first pulse sequence of the zeroth region data collection is smallest.

In the data collection method of the fourth aspect, it is possible to minimize change of the phase encode amount immediately before collecting the zeroth region data governing an image. Accordingly, artifacts caused by the influence of remaining magnetization or overcurrent can be minimum.

In a fifth aspect, the present invention provides the thus-constructed data collection method, wherein when I=3, a k space is divided into seven regions in total of a zeroth region, two first regions, two second regions, and two third regions, the nth region data collection and the zeroth region data collection are repeated while successively selecting the n from 1 to 3, thereby updating data filling the k space, a pulse sequence of the phase encode amount included in the first region is inserted twice between the first region data collection and the zeroth region data collection, a pulse sequence of the phase encode amount included in the first region is inserted twice between the second region data collection and the zeroth region data collection, and a pulse sequence of the phase encode amount included in the second region and a pulse sequence of the phase encode amount included in the first region are inserted between the third region data collection and the zeroth region data collection.

In the data collection method of the fifth aspect, a pulse sequence of the phase encode amount included in the first region adjacent to the outside of the zeroth region is inserted twice between the first region data collection and the zeroth region data collection or between the second region data collection and the zeroth region data collection. In addition, a pulse sequence of the phase encode amount included in the second region and a pulse sequence of the phase encode amount included in the first region are inserted successively between the third region data collection and the zeroth region data collection. This makes it possible to avoid sudden change of the phase encode amount immediately before collecting the zeroth region data governing an image. Accordingly, artifacts caused by the influence of remaining magnetization or overcurrent can be reduced.

In a sixth aspect, the present invention provides the thus-constructed data collection method, wherein the phase encode amount included in the first region is a phase encode amount in which a difference between the phase encode amount included in the first region and the phase encode amount of the first pulse sequence of the zeroth region data collection is smallest, and the phase encode amount included in the second region is a phase encode amount in which a difference between the phase encode amount included in the second region and the phase encode amount of the first pulse sequence of the zeroth region data collection is smallest.

In the data collection method of the sixth aspect, it is possible to minimize change of the phase encode amount immediately before collecting the zeroth region data governing an image. Accordingly, artifacts caused by the influence of remaining magnetization or overcurrent can be minimum.

In a seventh aspect, the present invention provides the thus-constructed data collection method, wherein data for bloodstream imaging is collected.

In the data collection method of the first and second aspects, the interval of the image reconstruction can be reduced to enhance real time properties. In particular, it is preferable for bloodstream imaging.

In an eighth aspect, the present invention provides a data collection method in which: data having a large phase encode amount is collected; and data having a small phase encode amount is collected, wherein when both the phase encode amounts are different greatly, a pulse sequence of an intermediate phase encode amount is inserted one or more times between both.

In the data collection method of the eighth aspect, when, after collecting data of a region having a large phase encode amount, data of a region governing an image having a smaller phase encode amount is collected successively, and a pulse sequence of an intermediate phase encode amount is inserted one or more times. This makes it possible to avoid sudden change of the phase encode amount. Accordingly, artifacts caused by the influence of remaining magnetization or overcurrent can be reduced.

In a ninth aspect, the present invention provides an MRI system including: a transmitting coil for transmitting an RF pulse; a gradient coil for applying a gradient magnetic field pulse; a receiving coil for receiving an NMR signal; data collection means for driving the transmitting coil, gradient coil, and receiving coil, dividing a k space into (2I+1) regions in total of a zeroth region positioned in the center of the phase encode axis direction, two first regions adjacent to the outside of the zeroth region, and an (i+1)th regions adjacent to the outside of an ith (=1 to I−1, and I≧2) regions, and repeating an nth (n is one selected from 1 to I) region data collection and the zeroth region data collection while changing the n successively, thereby updating data filling the k space; and buffer pulse sequence inserting means for driving the transmitting coil, gradient coil, and receiving coil and inserting a pulse sequence of the phase encode amount included in the first region one or more times between the nth region data collection and the zeroth region data collection.

The MRI system of the ninth aspect can preferably execute the data collection method of the first aspect.

In a tenth aspect, the present invention provides the thus-constructed MRI system, wherein the phase encode amount included in the first region is a phase encode amount in which a difference between the phase encode amount included in the first region and the phase encode amount of the first pulse sequence of the zeroth region data collection is smallest.

The MRI system of the tenth aspect can preferably execute the data collection method of the second aspect.

In an eleventh aspect, the present invention provides an MRI system including: a transmitting coil for transmitting an RF pulse; a gradient coil for applying a gradient magnetic field; a receiving coil for receiving an NMR signal; data collection means for driving the transmitting coil, gradient coil, and receiving coil, dividing a k space into (2I+1) regions of a zeroth region positioned in the center of the phase encode axis direction, two first regions adjacent to the outside of the zeroth region, and an (i+1)th regions adjacent to the outside of an ith (=1 to I−1, and I≧3) regions, and repeating an nth (n is one selected from 1 to I) region data collection and the zeroth region data collection while changing the n successively, thereby updating data filling the k space; and buffer pulse sequence inserting means for driving the transmitting coil, gradient coil, and receiving coil, inserting, with n=1 or n=2, a pulse sequence of the phase encode amount in the first region (I−1) times between the nth region data collection and the zeroth region data collection, and inserting, with n≧3, a pulse sequence of the phase encode amount included in from an (n−1)th region to the first region (I−1 times in total.

The MRI system of the eleventh aspect can preferably execute the data collection method of the third aspect.

In a twelfth aspect, the present invention provides the thus-constructed MRI system, wherein the phase encode amount included in from the (n−1)th region to the first region is a phase encode amount in which a difference between the phase encode amount included in from the (n−1)th region to the first region and the phase encode amount of the first pulse sequence of the zeroth region data collection is smallest.

The MRI system of the twelfth aspect can preferably execute the data collection method of the fourth aspect.

In a thirteenth aspect, the present invention provides the thus-constructed MRI system, wherein when I=3, a k space is divided into seven regions of a zeroth region, two first regions, two second regions, and two third regions, the nth region data collection and the zeroth region data collection are repeated while successively selecting the n from 1 to 3, thereby updating data filling the k space, a pulse sequence of the phase encode amount included in the first region is inserted twice between the first region data collection and the zeroth region data collection, a pulse sequence of the phase encode amount included in the first region is inserted twice between the second region data collection and the zeroth region data collection, and a pulse sequence of the phase encode amount included in the second region and a pulse sequence of the phase encode amount included in the first region are inserted between the third region data collection and the zeroth region data collection.

The MRI system of the thirteenth aspect can preferably execute the data collection method of the fifth aspect.

In a fourteenth aspect, the present invention provides the thus-constructed MRI system, wherein the phase encode amount included in the first region is a phase encode amount in which a difference between the phase encode amount included in the first region and the phase encode amount of the first pulse sequence of the zeroth region data collection is smallest, and the phase encode amount included in the second region is a phase encode amount in which a difference between the phase encode amount included in the second region and the phase encode amount of the first pulse sequence of the zeroth region data collection is smallest.

The MRI system of the fourteenth aspect can preferably execute the data collection method of the sixth aspect.

In a fifteenth aspect, the present invention provides the thus-constructed MRI system, wherein data for bloodstream imaging is collected.

The MRI system of the fifteenth aspect can preferably execute the data collection method of the seventh aspect.

In a sixteenth aspect, the present invention provides an MRI system including: a transmitting coil for transmitting an RF pulse; a gradient coil for applying a gradient magnetic field; a receiving coil for receiving an NMR signal; data collection means for driving the transmitting coil, gradient coil, and receiving coil, collecting data having a large phase encode amount, and collecting data having a small phase encode amount; and buffer pulse sequence inserting means for, when both the phase encode amounts are different greatly, inserting a pulse sequence of an intermediate phase encode amount one or more times between both.

The MRI system of the sixteenth aspect can preferably execute the data collection method of the eighth aspect.

According to the data collection method and the MRI system of the present invention, in the case that after collecting data of a region having a large phase encode amount, data of a region governing an image having a smaller phase encode amount is collected subsequently, a pulse sequence having an intermediate phase encode amount is inserted one or more times. The phase encode amount can be prevented from being changed suddenly. Accordingly, artifacts caused by the influence of remaining magnetization or overcurrent can be reduced.

Further objects and advantages of the present invention will be apparent from the following description of the preferred embodiments of the invention as illustrated in the accompanying drawings.

DETAILED DESCRIPTION OF THE INVENTION

Figure 1:
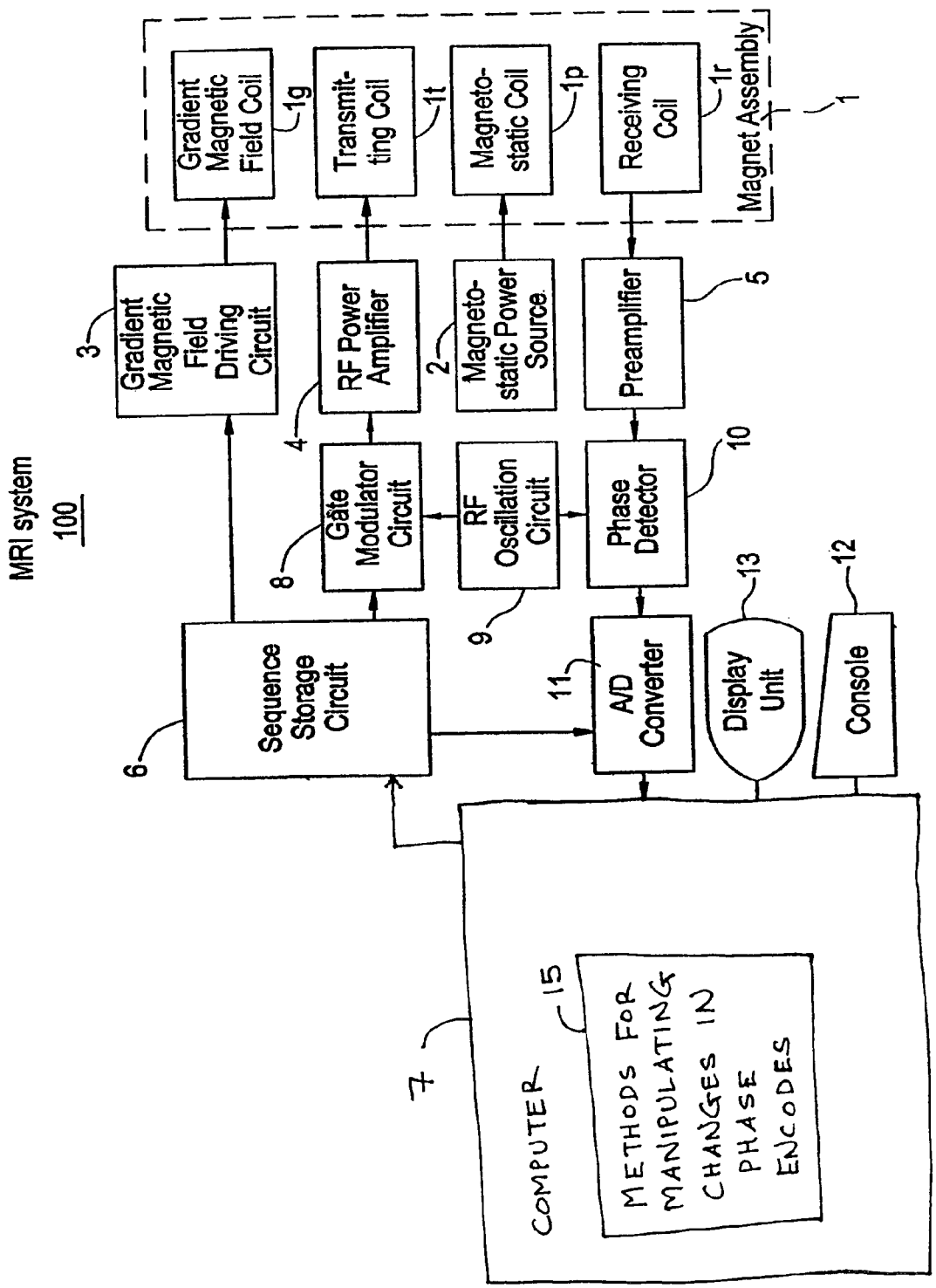
FIG. 1 is a block diagram of an MRI system according to an embodiment of the present invention.

The present invention will be described hereinbelow in greater detail with embodiments shown in the drawings.

FIG. 1 is a block diagram showing an MRI system according to an embodiment of the present invention.

In an MRI system 100, a magnet assembly 1 has a space portion (bore) for inserting a subject thereinto and arranges in such a manner as to surround the space portion, a magnetostatic coil 1p for applying a constant magnetostatic field to the subject, a gradient magnetic field coil 1g for producing X-, Y-, and Z-axis gradient magnetic fields (a combination of X axis, Y axis, and Z axis forms a slice gradient axis, a read gradient axis, and a phase encode gradient axis), a transmitting coil it for giving an RF pulse for exciting the nuclear spins in the subject, and a receiving coil 1r for detecting an NMR signal from the subject. The magnetostatic coil 1p, the gradient magnetic field coil 1g, the transmitting coil 1t, and the receiving coil 1r are respectively connected to a magnetostatic power source 2, a gradient magnetic field driving circuit 3, an RF power amplifier 4, and a preamplifier 5.

In place of the magnetostatic power source 2 and the magnetostatic coil 1p, a permanent magnet may be employed.

A sequence storage circuit 6 follows a command from a computer 7, and operates the gradient magnetic field driving circuit 3 based on a pulse sequence stored to produce a gradient magnetic field from the gradient magnetic field coil 1g of the magnet assembly 1. The sequence storage circuit 6 operates a gate modular circuit 8 to modulate a carrier wave output signal of an RF oscillation circuit 9 to a pulse-like signal of a predetermined timing and a predetermined envelope shape. Then, the pulse-like signal is added as an RF pulse to the RF power amplifier 4 and is power-amplified by the RF pulse amplifier 4 so as to be applied to the transmitting coil it of the magnet assembly 1. A desired imaging plane is selected and excited.

The preamplifier 5 amplifies an NMR signal from the subject received by the receiving coil 1r of the magnet assembly 1 and inputs the amplified signal to a phase detector 10. The phase detector 10 phase-detects the NMR signal from the preamplifier 5 with the carrier wave output signal of the RF oscillation circuit 9 as a reference signal and gives the signal to an AD converter 11. The AD converter 11 converts the phase-detected analog signal to digital data and inputs the data to the computer 7.

The computer 7 takes charge of the whole control including reception of information inputted from a console 12. The computer 7 also reads the digital data from the AD converter 11, and performs image reconstruction arithmetic operation to create an MR image. Computer 7 includes methods 15 for manipulating changes in phase encodes and executes the methods.

A display unit 13 displays the MR image.

Figures 2, 3:
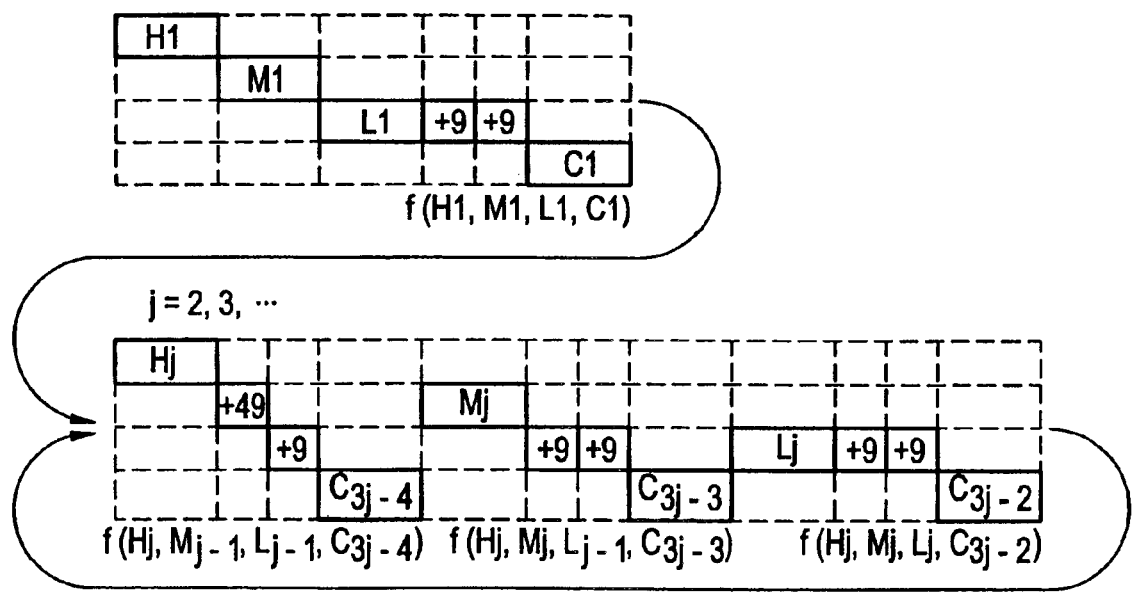
FIG. 2 is an explanatory view showing division of a k space.
FIG. 3 is an explanatory view showing the order of data collection according to an embodiment of the present invention.

FIGS. 2 and 3 are explanatory views showing a data collection process with the MRI system 100.

First, as shown in FIG. 2, a k space K is divided into seven regions in total of a zeroth region C positioned in the center of the phase encode axis direction, two first regions L adjacent to the outside of the zeroth region C, two second regions M adjacent to the outside of the first regions L, and two third regions H adjacent to the outside of the second regions M.

The phase encode amount of the zeroth region C is, e.g., −7 to +8. The phase encode amounts of the first regions L are, e.g., −47 to −6 and +9 to 48. The phase encode amounts of the second regions M are, e.g., −87 to −46 and +49 to 88. The phase encode amounts of the third regions H are, e.g., −127 to −88 and +89 to 128. The phase encode amount is a value conceptionally representing the polarity and magnitude order.

Data collection is performed in the order as shown in FIG. 3.

Figure 4:
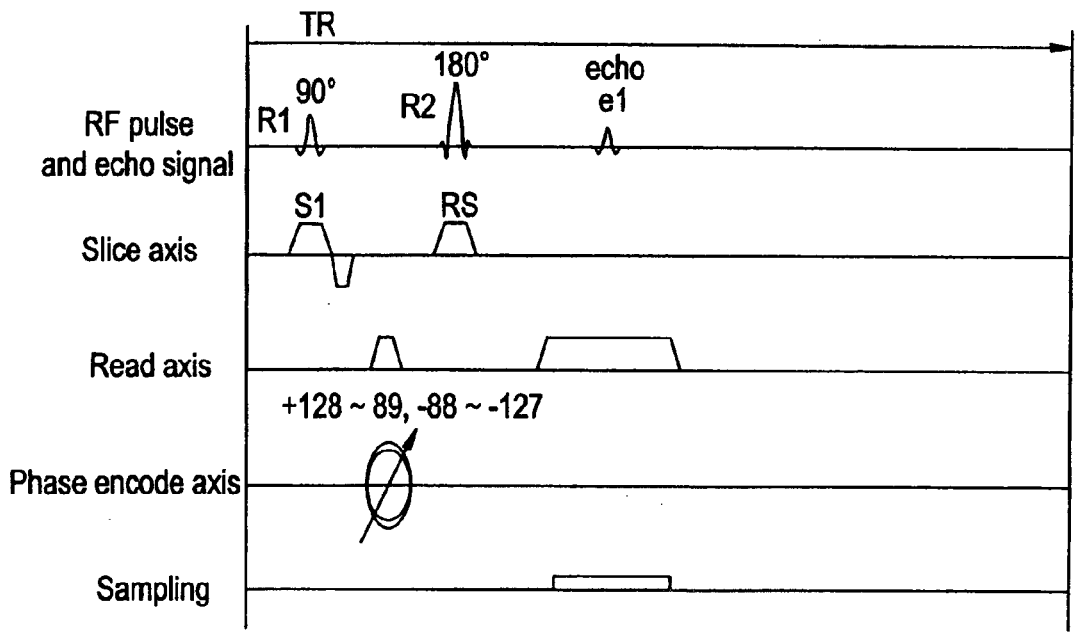
FIG. 4 is an illustration of a pulse sequence when collecting data of a third region.
Figure 5:
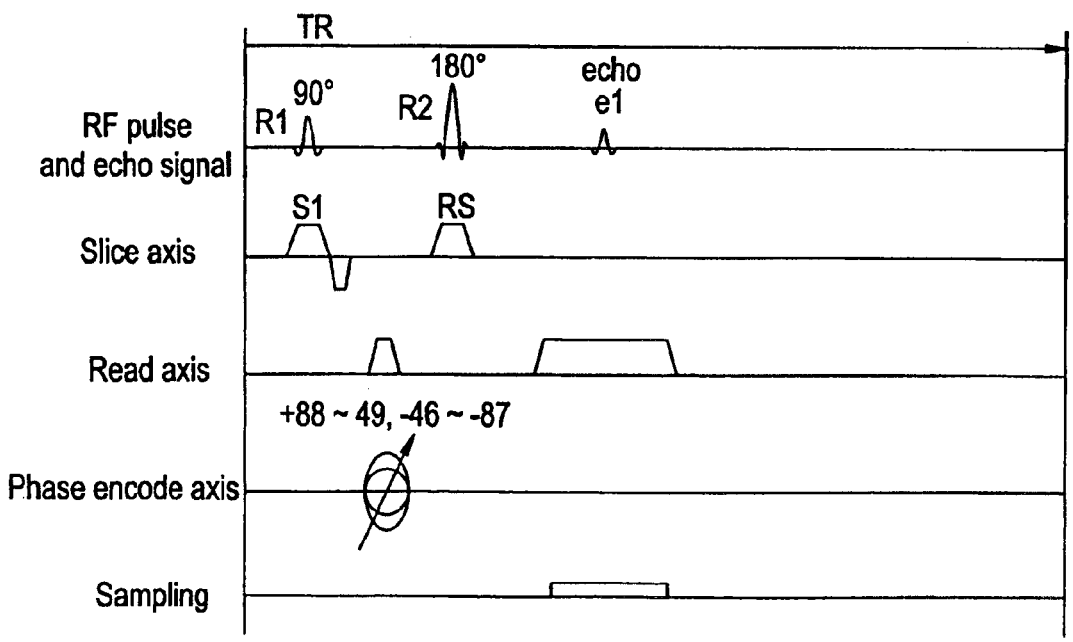
FIG. 5 is an illustration of a pulse sequence when collecting data of a second region.
Figure 6:
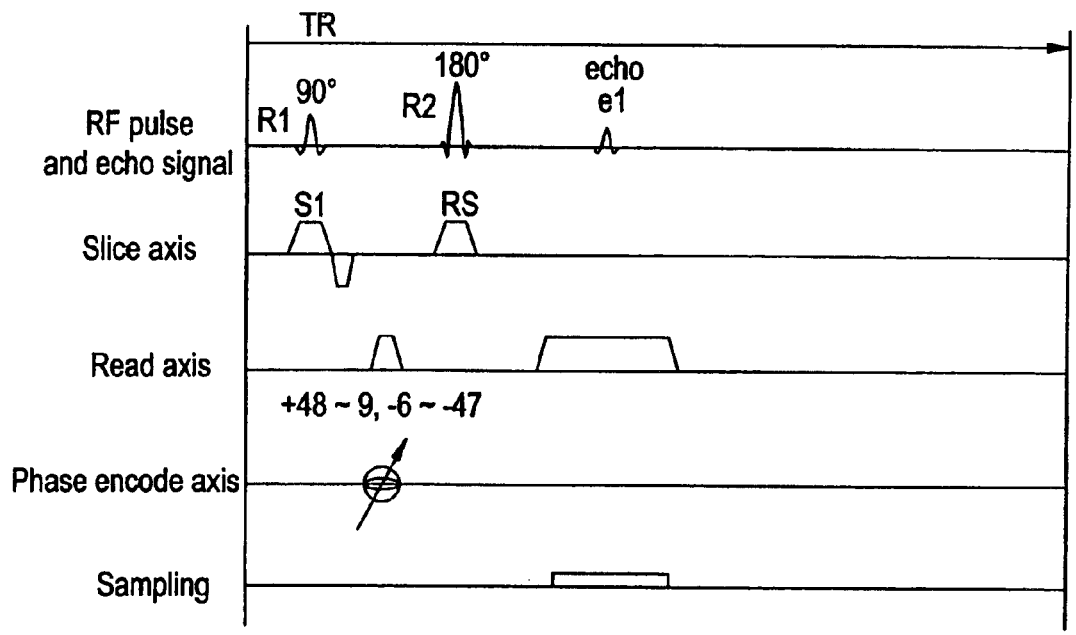
FIG. 6 is an illustration of a pulse sequence when collecting data of a first region.
Figure 7:
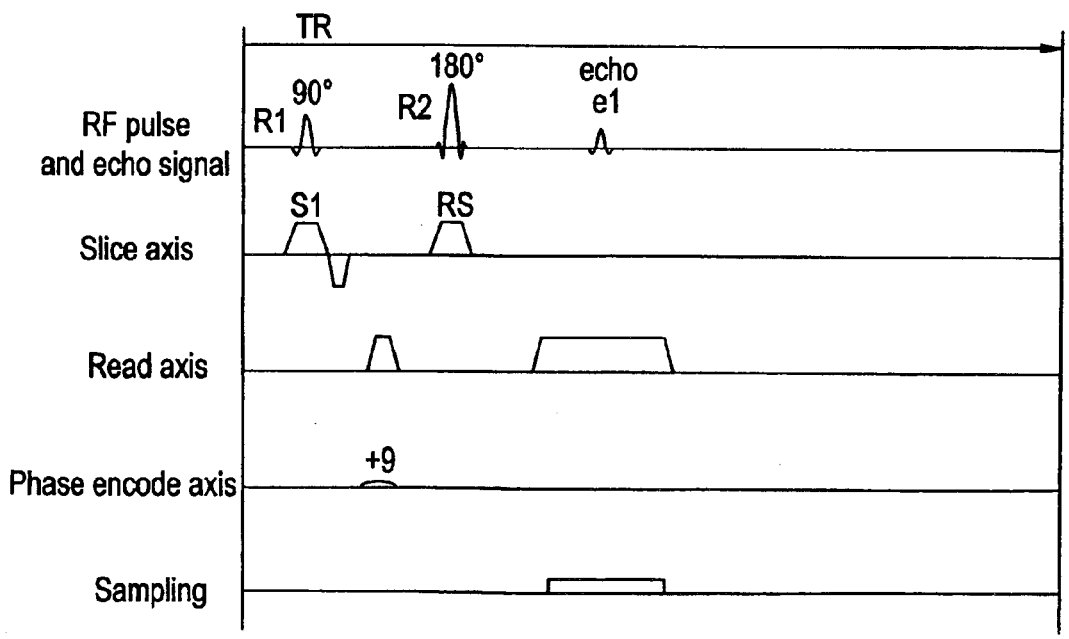
FIG. 7 is an illustration of a buffer pulse sequence.
Figure 8:
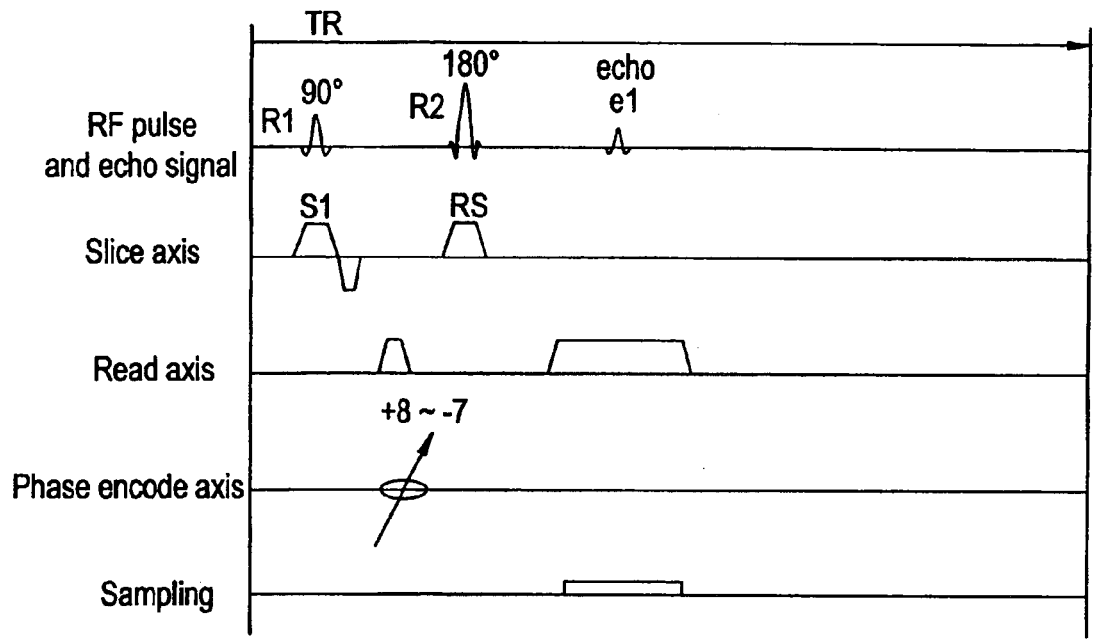
FIG. 8 is an illustration of a pulse sequence when collecting data of a zeroth region.

In other words, first, data H1 of the third region H is collected. An example of the pulse sequence at this time is shown in FIG. 4. Then, data M1 of the second region M is collected. An example of the pulse sequence at this time is shown in FIG. 5. Data L1 of the first region L is collected. An example of the pulse sequence at this time is shown in FIG. 6. There is executed twice a pulse sequence of the phase encode amount (+9) which is a phase encode amount included in the first region L and in which a difference between the phase encode amount included in the first region L and the phase encode amount (+8) of the first pulse sequence of the zeroth region C data collection is smallest. An example of the pulse sequence at this time is shown in FIG. 7. This is called a buffer pulse sequence. Data C1 of the zeroth region C is collected. An example of the pulse sequence at this time is shown in FIG. 8.

Figure 9:
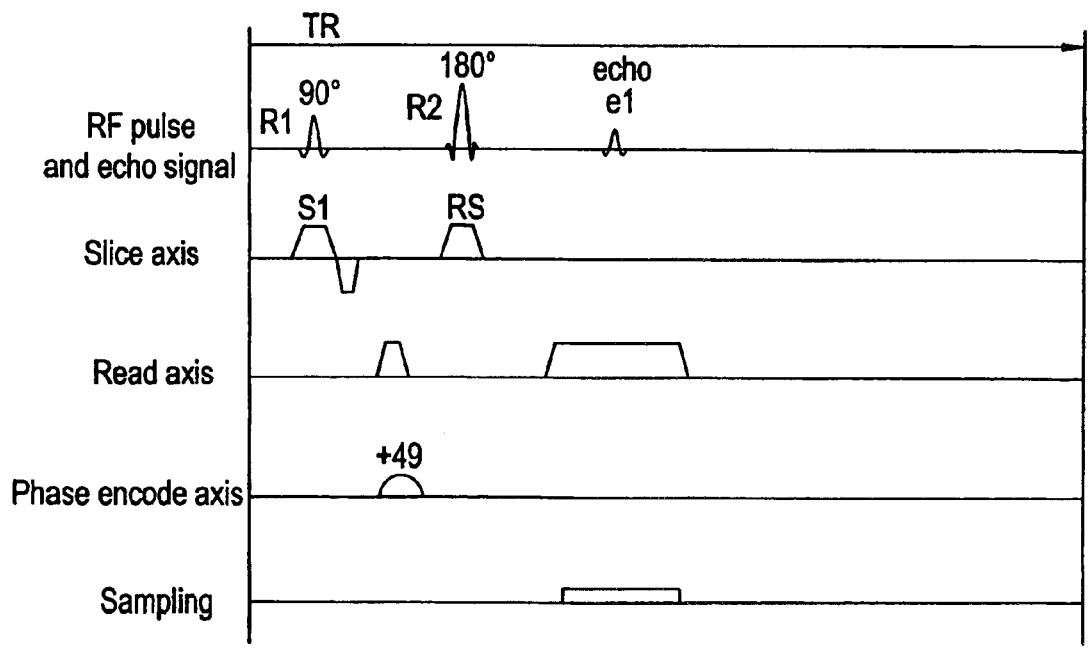
FIG. 9 is another illustration of the buffer pulse sequence.

With j=2, data Hj of the third region H is collected. There is executed once a pulse sequence of the phase encode amount (+49) which is a phase encode amount included in the second region M and in which a difference between the phase encode amount included in the second region M and the phase encode amount (+8) of the first pulse sequence of the zeroth region C data collection is smallest. An example of the pulse sequence at this time is shown in FIG. 9. This is called a buffer pulse sequence. There is executed once a pulse sequence of the phase encode amount (+9) which is a phase encode amount included in the first region L and in which a difference between the phase encode amount included in the first region L and the phase encode amount (+8) of the first pulse sequence of the zeroth region C data collection is smallest. Data $C_{3j-4}$ of the zeroth region C is collected.

Data Mj of the second region M is collected. There is executed twice a pulse sequence of the phase encode amount (+9) which is a phase encode amount included in the first region L and in which a difference between the phase encode amount included in the first region L and the phase encode amount (+8) of the first pulse sequence of the zeroth region C data collection is smallest. Data $C_{3j-3}$ of the zeroth region C is collected.

Data Lj of the first region M is collected. There is executed twice a pulse sequence of the phase encode amount (+9) which is a phase encode amount included in the first region L and in which a difference between the phase encode amount included in the first region L and the phase encode amount (+8) of the first pulse sequence of the zeroth region C data collection is smallest. Data $C_{3j-2}$ of the zeroth region C is collected.

While changing j to 3, 4, . . . , data collection and image reconstruction are repeated.

After collecting the zeroth region C data, the image reconstruction is performed using the latest zeroth region C data, the past latest third region H data, second region M data, and first region L data. The data collected in the buffer pulse sequence is not used in the image reconstruction.

Figure 10:
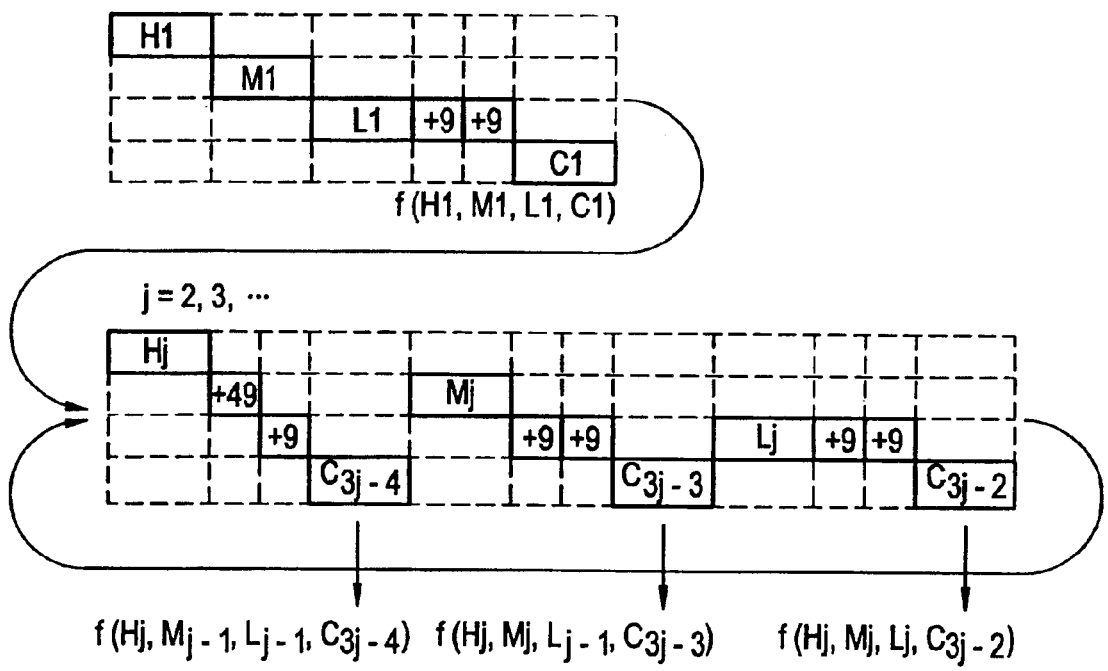
FIG. 10 is an explanatory view showing an image reconstructing method according to an embodiment of the present invention.
Figures 11, 12:
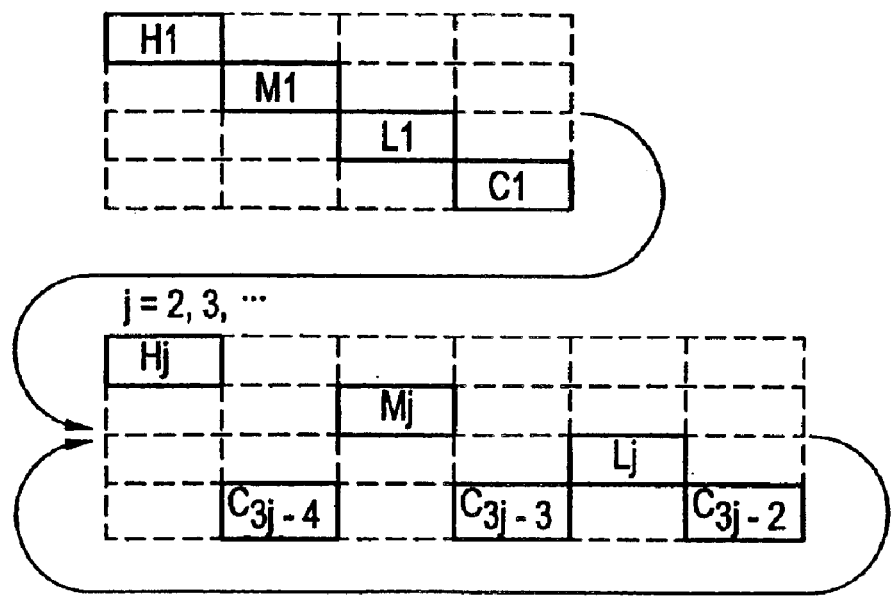
FIG. 11 is an explanatory view showing division of a k space.
FIG. 12 is an explanatory view showing the order of a prior art data collection.
Figure 13:
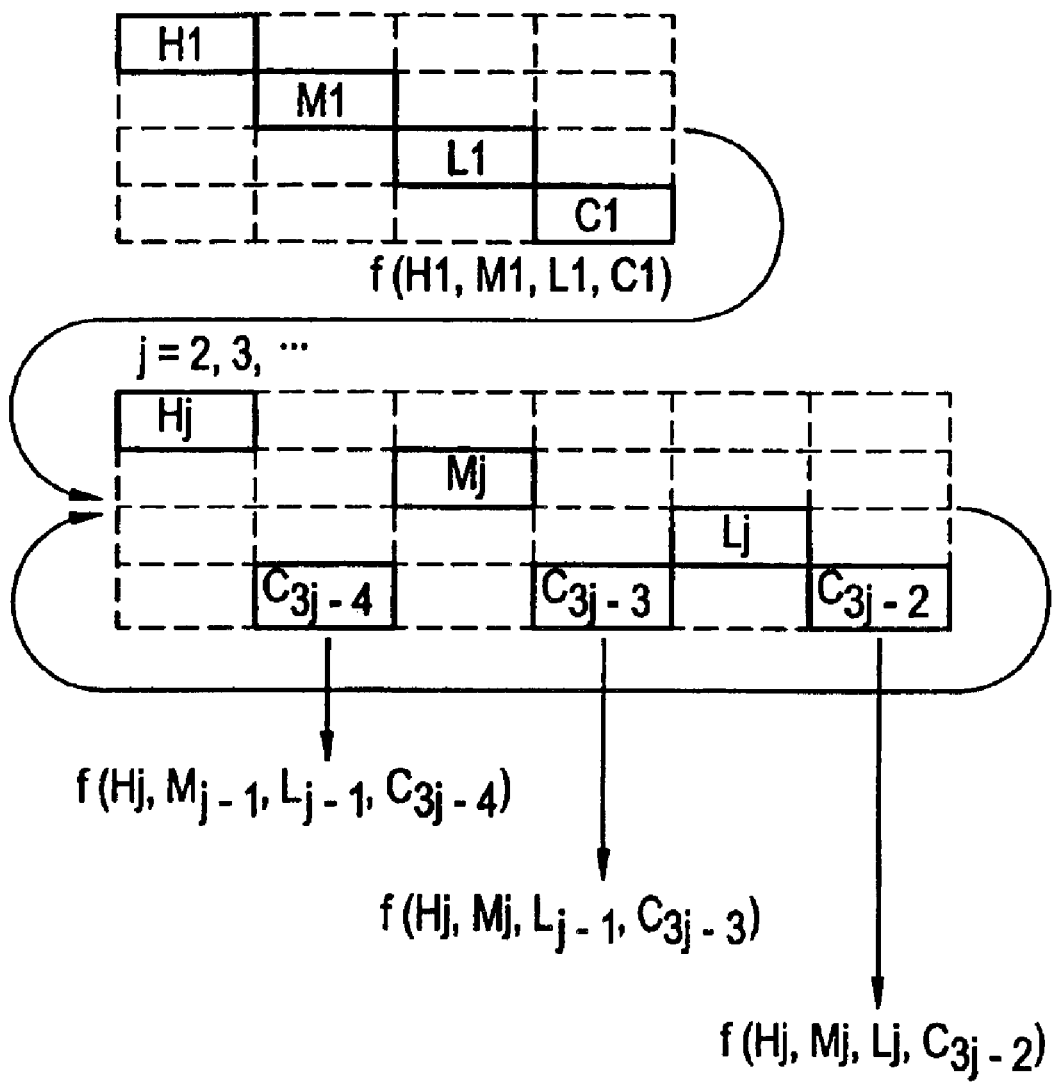
FIG. 13 is an explanatory view showing a prior art image reconstructing method.

In the reconstructing method, as shown in FIG. 10, first, an image f (H1, M1, L1, C1) is reconstructed. Then, with j=2, an image f ($Hj, M_{j-1}, L_{j-1}, C_{3j-4}$) is reconstructed, an image f ($Hj, Mj, L_{j-1}, C_{3j-3}$) is reconstructed, and an image f ($Hj, Mj, Lj, C_{3j-2}$) is reconstructed. While changing j to 3, 4, . . . , the image reconstruction is repeated.

Various image reconstructing methods disclosed in Japanese Unexamined Patent Publication No. Hei 10-5191 and U.S. Pat. No. 3,051,374 may be employed.

According to the MRI system 100, a buffer pulse sequence of the phase encode amount included in the first region L adjacent to the outside of the zeroth region is inserted one or more times between the third region H, the second region M and the first region L data collection and the zeroth region data collection. It is therefore possible to avoid sudden change of the phase encode amount immediately before collecting the zeroth region C data governing an image. Accordingly, artifacts caused by the influence of remaining magnetization or overcurrent can be reduced.

Other Embodiments (1) As the phase encode amount of the buffer pulse sequence, a given phase encode amount included in the first region L may be used. Preferably, the phase encode amount has the same polarity as that of the phase encode amount of the first pulse sequence of the zeroth region C data collection.

(2) The k space K may be divided into five regions of a zeroth region, two first regions L, and two second regions M. In this case, the buffer pulse sequence using the phase encode amount included in the first region L may be inserted only once.

(3) The k space K may be divided into nine regions of a zeroth region, two first regions L, two second regions M, two third regions H, and two fourth regions U. In this case, between the fourth region U data collection and the zeroth region C data collection, a buffer pulse sequence using the phase encode amount included in the third region H, a buffer pulse sequence using the phase encode amount included in the second region M, and a buffer pulse sequence using the phase encode amount included in the first region L may be inserted. Between the third region H data collection and the zeroth region C data collection, a buffer pulse sequence using the phase encode amount included in the second region M, and a buffer pulse sequence using the phase encode amount included in the first region L may be inserted twice. Between the second region M data collection and the zeroth region C data collection, a buffer pulse sequence using the phase encode amount included in the first region L may be inserted three times. Between the first region L data collection and the zeroth region C data collection, a buffer pulse sequence using the phase encode amount included in the first region L may be inserted three times.

(4) When the buffer pulse sequence using the phase encode amount included in the first region L is inserted multiple times, the phase encode amount may be decreased successively.

(5) Without being limited to the pulse sequences shown in FIGS. 4 to 9, the present invention can be applied to all the pulse sequences using Fourier transformation.

(6) Data having a large phase encode amount is collected, data having a small phase encode amount is collected, and when both the phase encode amounts are different greatly, a buffer pulse sequence of an intermediate phase encode amount may be inserted one or more times between both. This makes it possible to avoid sudden change of the phase encode amount. Artifacts caused by the influence of remaining magnetization or overcurrent can be reduced.

Many widely different embodiments of the invention may be configured without departing from the spirit and the scope of the present invention. It should be understood that the present invention is not limited to the specific embodiments described in the specification, except as defined in the appended claims.

What is claimed is:

1. A data collection method comprising:
dividing a k space into (2I+1) regions, wherein the (2I+1) regions include a zeroth region positioned in a center of a phase encode axis, two first regions, and two Ith regions lying along the phase encode axis, wherein one of the first regions lies between the zeroth region and one of the Ith regions, a remaining region of the first regions lies between the zeroth region and a remaining region of the Ith regions;
repeating a magnetic resonance (MR) data collection from an nth region while changing n successively to fill the k space, wherein n ranges from 1 to I;
intermittently collecting MR data corresponding to the zeroth region after each successive change in n; and
inserting a pulse sequence for at least one time to collect data between the MR data collection from the nth region and said intermittently collecting the MR data corresponding to the zeroth region, wherein the pulse sequence corresponds to a phase encode amount that is included in one of the first regions, and the phase encode amount is represented by a polarity and a magnitude along the phase encode axis.

2. The data collection method of claim 1, wherein a difference between the phase encode amount included in one of the first regions and a phase encode amount included in the zeroth region is a minimum value among values of differences between phase encode amounts included in one of the first regions and phase encode amounts included in the zeroth region.

3. The data collection method of claim 1, further comprising generating images of a blood stream from data that fills the k space.

4. The data collection method of claim 1 wherein I is at least equal to 2.

5. A data collection method comprising:
dividing a k space into (2I+1) regions, wherein the (2I+1) regions include a zeroth region positioned in a center of a phase encode axis, two first regions, and two Ith regions lying along the phase encode axis, wherein one of the first regions lies between the zeroth region and one of the Ith regions, a remaining region of the first regions lies between the zeroth region and a remaining region of the Ith regions;
repeating a magnetic resonance (MR) data collection from an nth region while changing n successively to fill the k space, wherein n ranges from 1 to I;
intermittently collecting MR data corresponding to the zeroth region after each successive change in n; and
inserting:
when n equals one of 1 and 2, a first pulse sequence for (I−1) times to collect data between the MR data collection from the nth region and said intermittently collecting the MR data corresponding to the zeroth region, wherein the first pulse sequence corresponds to a first phase encode amount that is included in one of the first regions, and the first phase encode amount is represented by a polarity and a magnitude along the phase encode axis; and
when n is at least equal to 3, a second pulse sequence for (I−1) times to collect data between the MR data collection from the nth region and said intermittently collection the MR data corresponding to the zeroth region, wherein the second pulse sequence corresponds to a second phase encode amount that is included in an (n−1)th region, and the second phase encode amount is represented by a polarity and a magnitude along the phase encode axis.

6. The data collection method of claim 5, wherein a difference between the second phase encode amount and a third phase encode amount included in the zeroth region is a minimum value among values of differences between phase encode amounts include in the (n−1)th region and phase encode amounts included in the zeroth region.

7. The data collection method of claim 5, wherein a difference between the first phase encode amount and a third phase encode amount included in the zeroth region is a minimum value among values of differences between phase encode amounts included in one of the first regions and phase encode amounts included in the zeroth region, and a difference between the second phase encode amount and the third phase encode amount included in the zeroth region is a minimum value among values of differences between phase encode mounts included in one of the second regions and the phase encode amounts included in the zeroth region.

8. The data collection method of claim 5, further comprising generating images of a blood stream from data that fills the k space.

9. The data collection method of claim 5 wherein I is at least equal to 3.

10. The data collection method of claim 5, wherein said dividing comprises dividing, when I equals 3, the k-space into seven regions including a zeroth region, the two first regions, two second regions, and two third regions.

11. The data collection method of claim 5 wherein said repeating the MR data collection from the nth region comprises repeating the MR data collection from the nth region while successively selecting n from 1 to 3 to fill the k space.

12. The data collection method of claim 11 wherein said inserting comprises at least one of:
inserting a third pulse sequence for two times to collect data between the MR data collection for one of the first two regions and the MR data collection for the zeroth region, wherein the third pulse sequence corresponds to the first phase encode amount that is included in one of the first regions;
inserting the third pulse sequence for two times to collect data between a data collection for one of the second regions and the MR data collection for the zeroth region;
inserting the third pulse sequence once to collect data between a data collection for one of the third regions and the MR data collection for the zeroth region; and
inserting a fourth pulse sequence once to collect data between the MR data collection for one of the two third regions and the MR data collection for the zeroth region, wherein the fourth pulse sequence corresponds to a third phase encode amount that is included in one of the second regions.

13. A data collection method comprising: collecting magnetic resonance (MR) data applying a first phase encode amount after each successive change in n ranging from 1 to I in a k-space divided into 2I+1 regions; and
inserting a pulse sequence, for at least one time, between said collecting MR data by applying the first phase encode amount and each successive change in n, wherein the pulse sequence corresponds to a second phase encode amount between the first phase encode amount and a third phase encode amount within the $I^{th}$ region, and the first, second, and third phase encode mounts correspond to polarities and magnitudes along a phase encode axis.

14. An MRI system comprising:
a magnet configured to apply a magnetic field to a subject;
a transmitting coil configured to excite spins within nuclei of the subject;
a gradient coil configured to apply at least one gradient to the magnetic field;
a receiving coil configured to receive an NMR signal generated from the spins to fill a k space;
a data collection device configured to divide the k space into (2I+1) regions, wherein the (2I+1) regions include a zeroth region positioned in a center of a phase encode axis, two first regions, and two Ith regions lying along the phase encode axis, wherein one of the first regions lies between the zeroth region and one of the Ith regions, a remaining region of the first regions lies between the zeroth region and a remaining region of the Ith regions, wherein said data collection device is configured to repeat a data collection from an nth region while changing n successively to fill the k, space and perform an intermittent collection of MR data corresponding to the zeroth region after each successive change in n, and n from 1 to I; and
a buffer pulse sequence inserting device configured to insert a pulse sequence for at least one time to collect data between the data collection from the nth region and the intermittent collection of the MR data corresponding to the zeroth region, wherein the pulse sequence corresponds to a phase encode amount that is included in one of the first regions, and the phase encode amount is represented by a polarity and a magnitude along the phase encode axis.

15. The MRI system of claim 14, wherein a difference between the phase encode amount included in one of the first regions and a phase encode amount included in the zeroth region is a minimum value among values of differences between phase encode amounts included in one of the first regions and phase encode amounts included in the zeroth region.

16. The MRI system of claim 14, wherein said data collection device generates images of a blood stream from data that fills the k space.

17. An MRI system comprising:
a magnet configured to apply a magnetic field to a subject;
a transmitting coil configured to excite spins within nuclei of the subject;
a gradient coil configured to apply at least one gradient to the magnetic field;
a receiving coil configured to receive an NMR signal generated from the spins to fill a k space;
a data collection device configured to divide the k space into (2I+1) regions, wherein the (2I+1) regions include a zeroth region positioned in a center of a phase encode axis, two first regions, and two Ith regions lying along the phase encode axis, wherein one of the first regions lies between the zeroth region and one of the Ith regions, a remaining region of the first regions lies between the zeroth region and a remaining region of the Ith regions, wherein said data collection device is configured to repeat a data collection from an nth region while changing n successively to fill the k, space and perform an intermittent collection of MR data corresponding to the zeroth region after each successive change in n, wherein n ranges from 1 to I; and
a buffer pulse sequence inserting device configured to insert;
when n equals one of 1 and 2, a first pulse sequence for (I−1) times to collect data between the data collection from the nth region and the intermittent collection of the MR data corresponding to the zeroth region, wherein the first pulse sequence corresponds to a first phase encode amount that is included in one of the first regions, and the first phase encode amount is represented by a polarity and a magnitude along the phase encode axis; and when n is at least equal to 3, a second pulse sequence for (I−1) times to collect data between the data collection from the nth region and the intermittent collection of the MR data corresponding to the zeroth region, wherein the second pulse sequence corresponds to a second phase encode amount that is included in an (n−1)th region, and the second phase encode amount is represented by a polarity and a magnitude along the phase encode axis.

18. The MRI system of claim 17, wherein a difference between the second phase encode amount and a third phase encode amount included in the zeroth region is a minimum value among values of differences between phase encode amounts included in the (n−1)th region and phase encode amounts included in the zeroth region.

19. The MRI system of claim 17, wherein to divide the k space said data collection device configured to divide, when I equals 3, the k-space into seven regions including a zeroth region, the two first regions, two second regions, and two third regions.

20. The MRI system of claim 17 wherein to repeat the MR data collection from the nth region and the MR data collection for the zeroth region said data collection device configured to repeat the MR data collection from the nth region and the MR data collection for the zeroth region while successively selecting n from 1 to 3 to fill the k space.

21. The claim 20 wherein to insert said buffer pulse sequence inserting device configured to perform at least one of:

inserting a third pulse sequence for two times to collect data between the data collection for one of the first two regions and the data collection for the zeroth region, wherein the third pulse sequence corresponds to the first phase encode amount that is included in one of the first regions; and inserting the third pulse sequence for two times to collect data between a data collection for one of the second regions and the data collection for the zeroth region;

inserting the third pulse sequence once to collect data between a data collection for one of the third regions and the data collection for the zeroth region; and inserting a fourth pulse sequence once to collect data between the data collection for one of the two third regions and the data collection for the zeroth region, wherein the fourth pulse sequence corresponds to a third phase encode amount that is included in one of the second regions.

22. The MRI system of claim 17, wherein a difference between the first phase encode amount and a third phase encode amount included in the zeroth region is a minimum value among values of differences between phase encode amounts included in one of the first regions and phase encode amounts included in the zeroth region, and a difference between the second phase encode amount and the third phase encode amount included in the zeroth region is a minimum value among values of differences between phase encode amounts included in one of the second regions and phase encode amounts included in the zeroth region.

23. The MRI system of claim 17, wherein said data collection device generates images of a blood stream from data that fills the k space.

24. An MRI system comprising:

a magnet configured to apply a magnetic field to a subject;

a transmitting coil configured to excite spins within nuclei of the subject;

a gradient coil configured to apply at least one gradient to the magnetic field;

a receiving coil configured to receive an NMR signal generated from the spins to fill a k space;

a data collection device configured to collect data by applying a first phase encode amount after each successive change in n ranging from 1 to I in a k-space divided into 2I+1 regions; and a buffer pulse sequence inserting device configured to insert a pulse sequence, for at least one time, between collecting the data obtained by using the first phase encode amount and each successive change in n, wherein the pulse sequence corresponds to a second phase encode amount between the first phase encode amount and a third phase encode amount within the $I^{th}$ region, and the first, second, and third phase encode amounts correspond to polarities and magnitudes along a phase encode axis.

* * * * *

UNITED STATES PATENT AND TRADEMARK OFFICE
CERTIFICATE OF CORRECTION

PATENT NO. : 6,940,280 B2 Page 1 of 1
APPLICATION NO. : 10/123329
DATED : September 6, 2005
INVENTOR(S) : Asano et al.

It is certified that error appears in the above-identified patent and that said Letters Patent is hereby corrected as shown below:

In Claim 5, column 10, line 63, delete "collection the MR" and insert therefor -- collecting the MR --.
In Claim 6, column 11, line 5, delete "include" and insert therefor -- included --.
In Claim 7, column 11, line 16, delete "mounts" and insert therefor -- amounts --.
In Claim 13, column 11, line 53, between "data" and "applying" insert -- by --.
In Claim 13, column 11, line 63, delete "mounts" and insert therefor -- amounts --.
In Claim 14, column 12, line 17, delete "k, space" and insert therefor -- k space --.
In Claim 14, column 12, line 20, between "n" and "from" insert -- ranges --.
In Claim 17, column 12, line 58, delete "k, space" and insert therefor -- k space --.
In Claim 17, column 12, line 663, delete "insert;" and insert therefor -- insert: --.
In Claim 21, column 13, line 34, between "The" and "claim" insert -- MRI system of --.

Signed and Sealed this

Sixth Day of November, 2007

JON W. DUDAS
*Director of the United States Patent and Trademark Office*